United States Patent
Han et al.

(10) Patent No.: US 8,957,319 B2
(45) Date of Patent: Feb. 17, 2015

(54) METHOD FOR REMOVING SEED LAYER IN MANUFACTURING PRINTED CIRCUIT BOARD AND PRINTED CIRCUIT BOARD MANUFACTURED BY USING THE SAME

(71) Applicant: Samsung Electro-Mechanics Co., Ltd., Suwon (KR)

(72) Inventors: Sung Han, Suwon (KR); Yoon Su Kim, Suwon (KR); Kyoung Moo Harr, Suwon (KR); Kyung Seob Oh, Suwon (KR); Kyung Suk Shim, Suwon (KR); Du Sung Jung, Suwon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 148 days.

(21) Appl. No.: 13/826,857

(22) Filed: Mar. 14, 2013

(65) Prior Publication Data

US 2014/0076619 A1   Mar. 20, 2014

(30) Foreign Application Priority Data

Sep. 20, 2012   (KR) .................. 10-2012-0104449

(51) Int. Cl.
*H05K 3/02*   (2006.01)
*H05K 1/09*   (2006.01)
*H05K 3/06*   (2006.01)
*H05K 1/02*   (2006.01)
*H05K 3/10*   (2006.01)

(52) U.S. Cl.
CPC .. *H05K 3/06* (2013.01); *H05K 1/02* (2013.01); *H05K 3/027* (2013.01); *H05K 3/108* (2013.01); *H05K 2203/087* (2013.01); *H05K 2203/107* (2013.01)
USPC ............................................. 174/257; 29/847

(58) Field of Classification Search
USPC .............................. 174/255–261; 29/846–853
See application file for complete search history.

(56) References Cited

FOREIGN PATENT DOCUMENTS

| KR | 10-2011-0060370 | 6/2011 |
|---|---|---|
| KR | 10-2011-0078835 | 7/2011 |

*Primary Examiner* — Jeremy C Norris

(57) ABSTRACT

Disclosed herein is a method for removing a seed layer in manufacturing a printed circuit board, the method including: forming a photo resist layer on a printed circuit board having a seed layer formed on a surface thereof; removing the photo resist layer according to a predetermined pattern; forming a plating layer for a circuit on the predetermined pattern from which the photo resist layer is removed; exposing the seed layer by removing the photo resist layer around the plating layer; forming a corrosion layer on surfaces of the seed layer and the plating layer by performing a chemical reaction of the substrate from which the seed layer is exposed in a reactor in which a predetermined gas is filled; and removing the seed layer by irradiating a laser on the corrosion layer to remove the corrosion layer.

15 Claims, 3 Drawing Sheets

METHOD FOR REMOVING SEED LAYER IN MANUFACTURING PRINTED CIRCUIT BOARD AND PRINTED CIRCUIT BOARD MANUFACTURED BY USING THE SAME

CROSS REFERENCE(S) TO RELATED APPLICATIONS

This application claims the benefit under 35 U.S.C. Section 119 of Korean Patent Application Serial No. 10-2012-0104449, entitled "Method for Removing Seed Layer in Manufacturing Printed Circuit Board and Printed Circuit Board Manufactured by Using the Same" filed on Sep. 20, 2012, which is hereby incorporated by reference in its entirety into this application.

BACKGROUND OF THE INVENTION

1. Technical Field

The present invention relates to the manufacture of a printed circuit board, and more particularly, to a method for removing a seed layer in manufacturing a printed circuit board and a printed circuit board manufactured by using the same.

2. Description of the Related Art

In accordance with the recent trend of miniaturization and high functionalization, high integration of an electro circuit is required, and therefore, it is important to reduce width and space of a copper wiring in a printed circuit board (PCB). In addition, to this end, a semi additive process (SAP) scheme in which a seed layer is formed by sputtering, and an electroplating layer for forming a circuit pattern is then formed has become prominent.

In manufacturing the printed circuit board using the SAP scheme, after an electro plating process and removal of a photo resist are completed, a tie layer and the seed layer need to be removed. Here, in the case of removing the tie layer and the seed layer using a wet etching scheme, since a form in which the tie layer and the seed layer are etched is not elaborate, serious problems such as damage to a wiring or disconnection may occur in a fine pattern of the copper wiring. Therefore, it is required to use a dry etching method rather than a wet etching method in manufacturing the printed circuit board. To this end, methods such as reactive ion etching (RIE) or laser ablation have been used.

Meanwhile, in removing a redistribution layer (RDL) seed layer by using the laser ablation, there are problems as follows.

1) In the case of a circuit pattern of 5 μm or less, problems occur in resolution of the pattern.

2) Since a laser having large energy (for example, energy of 650 mJ/cm$^2$ or more in the case of an excimer laser) is used, there is a risk that reproducibility and an electroplated copper RDL are damaged at the time of repeatedly performing work.

3) Since energy of 650 mJ/cm$^2$ or more needs to be accumulated in the seed layer, a relatively long processing time is required for a laser scanning.

Therefore, in order to effectively etch the pattern of 3 μm or less, an improved technology is required.

RELATED ART DOCUMENT

Patent Document (Patent Document 1) Korean Patent Laid-Open Publication No. 10-2011-0078835

(Patent Document 2) Korean Patent Laid-Open Publication No. 10-2011-0060370

SUMMARY OF THE INVENTION

An object of the present invention is to provide a method for removing a copper seed layer in manufacturing a printed circuit board capable of obtaining a precise wiring pattern even with low energy supply and preventing damage to a copper redistribution layer (RDL) by using a dry etching scheme rather than a wet etching scheme of the related art and performing laser ablation as the dry etching scheme for removing the copper seed layer, and more specifically, causing a chemical reaction by a chlorine gas to form a chloride corrosion layer on the seed layer, and then performing laser ablation, and a printed circuit board manufactured by using the same.

According to a first exemplary embodiment of the present invention, there is provided a method for removing a seed layer in manufacturing a printed circuit board, the method including: a) forming a photo resist layer on a printed circuit board having a seed layer formed on a surface thereof; b) removing the photo resist layer according to a predetermined pattern; c) forming a plating layer for a circuit on the predetermined pattern from which the photo resist layer is removed; d) exposing the seed layer by removing the photo resist layer around the plating layer; e) forming a corrosion layer on surfaces of the seed layer and the plating layer by performing a chemical reaction of the substrate from which the seed layer is exposed in a reactor in which a predetermined gas is filled; and f) removing the seed layer by irradiating a laser on the corrosion layer to remove the corrosion layer.

In step a), the seed layer may be formed of a copper (Cu) layer or a composite layer in which the copper layer and a hetero metal layer are laminated.

The composite metal layer may be formed of any one single metal layer selected from a group consisting of Ti, Cr, Ni, Mo, Ta, W, TiW, NiCu, NiCr, TaW, and TiN, or an alloy layer thereof.

In step a), the photo resist layer may be formed by using a plating scheme.

In step b), a mask having a predetermined pattern may be attached onto the photo resist layer and then a photolithography process may be performed thereon, in order to remove the photo resist layer according to a predetermined pattern.

In step c), the plating layer may be a copper (Cu) plating layer.

In step c), the plating layer may be formed by an electrolysis plating method.

In step e), the chemical reaction of the substrate from which the seed layer is exposed may be performed in a reactor in which any one gas is filled, the gas being selected from a group consisting of chlorine ($Cl_2$) gas, chloroform ($CHCl_3$) gas, hydrogen chloride (HCl) gas, carbon tetrachloride ($CCl_4$) gas, and boron trichloride ($BCl_3$) gas.

In step e), a chloride corrosion layer may be formed on surfaces of the seed layer and the plating layer.

In step e), the chemical reaction by any one gas selected from a group consisting of chlorine ($Cl_2$) gas, chloroform ($CHCl_3$) gas, hydrogen chloride (HCl) gas, carbon tetrachloride ($CCl_4$) gas, and boron trichloride ($BCl_3$) gas may include a plasma treatment by the selected gas.

In step e), a corrosion rate by any one gas selected from the group consisting of chlorine ($Cl_2$) gas, chloroform ($CHCl_3$) gas, hydrogen chloride (HCl) gas, carbon tetrachloride ($CCl_4$) gas, and boron trichloride ($BCl_3$) gas may be increased by injecting argon (Ar) into the reactor and applying a bias to the substrate while simultaneously performing a chemical reaction by the gas selected from the group consisting of chlorine ($Cl_2$) gas, chloroform ($CHCl_3$) gas, hydrogen chloride (HCl) gas, carbon tetrachloride ($CCl_4$) gas, and boron trichloride ($BCl_3$) gas.

The corrosion rate by any one gas selected from the group consisting of chlorine ($Cl_2$) gas, chloroform ($CHCl_3$) gas, hydrogen chloride (HCl) gas, carbon tetrachloride ($CCl_4$) gas, and boron trichloride ($BCl_3$) gas may be constantly maintained by injecting a hydrogen ($H_2$) gas into the reactor.

In step f), a laser having an energy of 150 mJ/cm$^2$ may be irradiated on the corrosion layer, in order to remove the corrosion layer.

According to a second exemplary embodiment of the present invention, there is provided a printed circuit board manufactured by using a method for removing a seed layer in manufacturing the printed circuit board, including forming a corrosion layer on surfaces of the seed layer and a plating layer by performing a chemical reaction of a substrate from which the seed layer is exposed in a reactor in which a predetermined gas is filled, and removing the seed layer by irradiating a laser on the corrosion layer to remove the corrosion layer, the printed circuit board including: a printed circuit board corresponding to a base; the seed layer formed on an upper surface of the printed circuit board according to a predetermined pattern; and the plating layer having a predetermined pattern and laminated on the seed layer, wherein the plating layer has a chlorine (Cl) component present on the upper surface and a side surface thereof.

The upper surface of the plating layer may have specific directional X-ray diffraction characteristics according to a crystal surface-220 preferential etching.

DESCRIPTION OF THE PREFERRED EMBODIMENTS

Terms or words used in the specification and the appended claims are not construed to be limited to a dictionary definition but are to be construed as meanings and concepts meeting the technical details of the present invention based on the principle that the concept of the term can be properly defined in order to describe the present invention by the best way.

In addition, unless explicitly described to the contrary, the word "comprise" and variations such as "comprises" or "comprising", will be understood to imply the inclusion of stated elements but not the exclusion of any other elements. In addition, the terms "-er", "-or", "module", and "block" described in the specification mean units for processing at least one function and operation, and can be implemented by hardware components or software components and combinations thereof.

Hereinafter, embodiments of the present invention will be described in detail with reference to the accompanying drawings.

Figure 1:
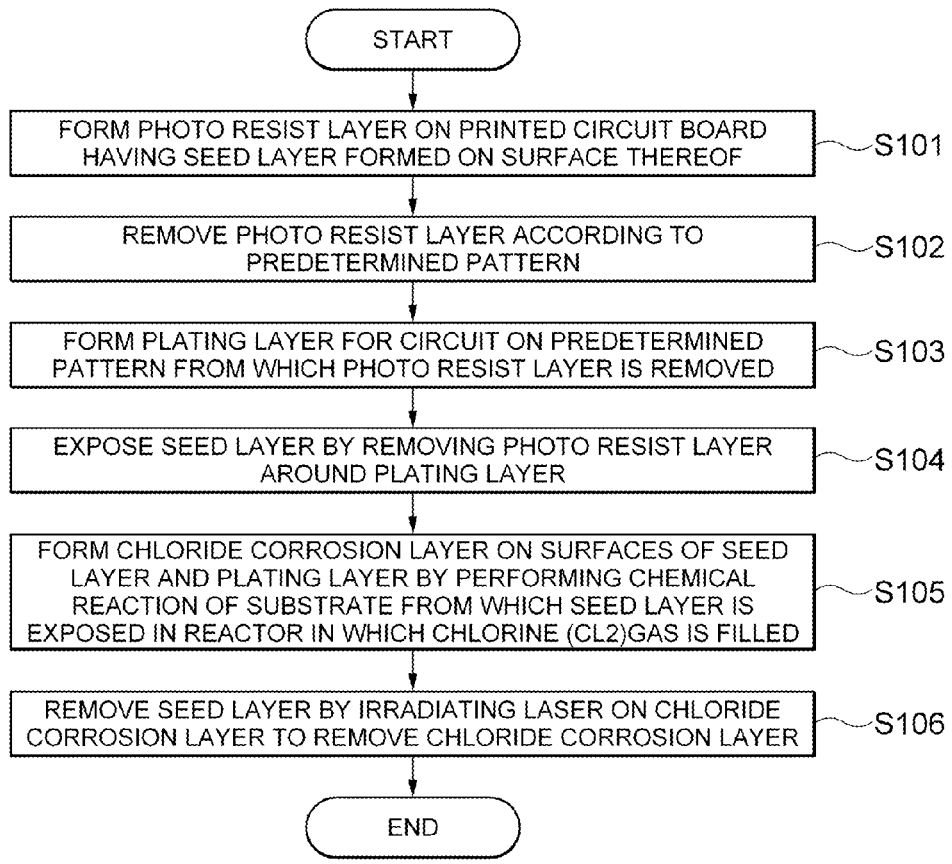
FIG. 1 is a flow chart showing an execution process of a method for removing a seed layer in manufacturing a printed circuit board according to an exemplary embodiment of the present invention.

FIG. 1 is a flow chart showing an execution process of a method for removing a seed layer in manufacturing a printed circuit board according to an exemplary embodiment of the present invention; and FIGS. 2A through 2F are views sequentially showing a process for removing the seed layer according to the method for removing the seed layer in manufacturing the printed circuit board according to the exemplary embodiment of the present invention.

Referring to FIGS. 1, and 2A through 2F, in accordance with the method for removing the seed layer in manufacturing the printed circuit board according to the exemplary embodiment of the present invention, a photo resist layer 203 is formed on the printed circuit board 201 having the seed layer 202 formed on a surface thereof (S101). Here, the seed layer 202 may be formed of a single layer only made of Cu, or a composite layer in which the copper and a hetero metal layer are laminated.

The hetero metal layer may be formed of any one of a single metal layer selected from a group consisting of Ti, Cr, Ni, Mo, Ta, W, TiW, NiCu, NiCr, TaW, and TiN, or an alloy layer thereof.

A case where the hetero metal layer is formed of a Cu/Ti composite layer will be described in the exemplary embodiment of the present invention. In addition, a plating scheme may be used for forming the photo resist layer 203.

When formation of the photo resist layer 203 is completed, the photo resist layer 203 is removed to be a predetermined pattern 203$p$ (S102). Here, in order to remove the photo resist layer 203 to be the predetermined pattern 203$p$, a mask having the predetermined pattern (for example, a pattern having a specific form previously designed for forming a circuit or a wiring) is attached to the photo resist layer 203, and a photolithography process is then performed, thereby making it possible to remove the photo resist layer 203 according to the predetermined pattern.

As described above, when the removal of the photo resist layer 203 to be the predetermined pattern 203$p$ is completed, a plating layer 204 for a circuit (or a wiring) (redistribution layer: RDL) is formed on the predetermined pattern 203$p$ from which the photo resist layer 203 is removed (S103). Here, the plating layer 204 may be a copper (Cu) plating layer. In addition, an electroplating method may be used for forming the plating layer 204.

When the formation of the plating layer 204 is completed, the photo resist layer 203 around the plating layer 204 is removed to expose the seed layer 202 (S104).

Thereafter, a chemical reaction of the substrate 201 from which the seed layer 202 is exposed is performed in a reactor in which a predetermined gas is filled to thereby form a corrosion layer 205 on surfaces of the seed layer 202 and the plating layer 204 (S105). Here, the chemical reaction of the substrate 201 from which the seed layer 202 is exposed is performed in a reactor in which any one gas is filled, the gas being selected from a group consisting of chlorine ($Cl_2$) gas, chloroform ($CHCl_3$) gas, hydrogen chloride (HCl) gas, carbon tetrachloride ($CCl_4$) gas, and boron trichloride ($BCl_3$) gas. Also, gas species filled in a reactor are not defined as the above stated, but all corrosive gases containing chloride (Cl) or all plasma enhanced corrosive gases as by-products containing chloride (Cl) may be used.

A case where the chlorine ($Cl_2$) gas is filled in the reactor will be described in the exemplary embodiment of the present invention. Therefore, a chloride (for example, CuCl) corrosion layer is formed on surfaces of the seed layer 202 and the plating layer 204.

In addition, the chemical reaction by any one gas selected from a group consisting of chlorine ($Cl_2$) gas, chloroform ($CHCl_3$) gas, hydrogen chloride (HCl) gas, carbon tetrachloride ($CCl_4$) gas, and boron trichloride ($BCl_3$) gas includes a plasma treatment by the selected gas, which is the chlorine ($Cl_2$) gas in the exemplary embodiment of the present invention). In addition, a corrosion rate by any one gas selected from the group consisting of chlorine ($Cl_2$) gas, chloroform ($CHCl_3$) gas, hydrogen chloride (HCl) gas, carbon tetrachloride ($CCl_4$) gas, and boron trichloride ($BCl_3$) gas is increased by injecting argon (Ar) into the reactor and applying a bias to the substrate while simultaneously performing the chemical reaction by the gas selected from the group consisting of chlorine ($Cl_2$) gas, chloroform ($CHCl_3$) gas, hydrogen chloride (HCl) gas, carbon tetrachloride ($CCl_4$) gas, and boron trichloride ($BCl_3$) gas.

Here, it is preferable that the corrosion rate by any one gas selected from the group consisting of chlorine ($Cl_2$) gas, chloroform ($CHCl_3$) gas, hydrogen chloride (HCl) gas, carbon tetrachloride ($CCl_4$) gas, and boron trichloride ($BCl_3$) gas is constantly maintained by injecting a hydrogen ($H_2$) gas into the reactor.

As described above, when the formation of the corrosion layer 205 (for example, a chloride corrosion layer) is completed, a laser is irradiated on the corrosion layer (the chloride corrosion layer) 205 to remove the corrosion layer (the chloride corrosion layer) 205, thereby removing the seed layer 202 (S106). Here, in the removal of the corrosion layer (the chloride corrosion layer) 205 by irradiating the laser on the corrosion layer (the chloride corrosion layer) as described above, a laser having energy of 150 $mJ/cm^2$ may be irradiated. The reason is that in the case of using the existing excimer laser, energy of 650 $mJ/cm^2$ or more is required at a single pulse mode in order to remove copper (Cu); however, the CuCl corrosion layer 205 may be easily removed even with energy significantly lower than energy required for removing the copper, such that even through the laser having energy of 150 $mJ/cm^2$ is irradiated, the CuCl corrosion layer 205 may be easily removed.

Figure 3:
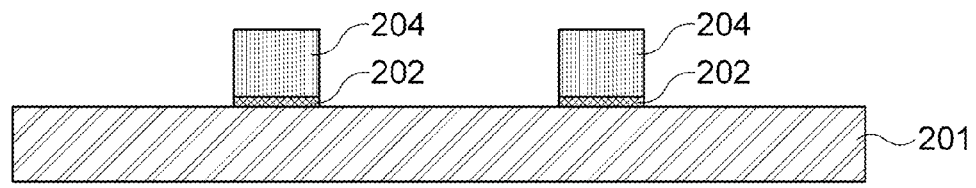
FIG. 3 is a view showing a structure of the printed circuit board manufactured by using the method for removing the seed layer in manufacturing the printed circuit board according to the exemplary embodiment of the present invention.

Meanwhile, FIG. 3 is a view showing a structure of the printed circuit board manufactured by using the method for removing the seed layer in manufacturing the printed circuit board according to the exemplary embodiment of the present invention.

Figure 2A:
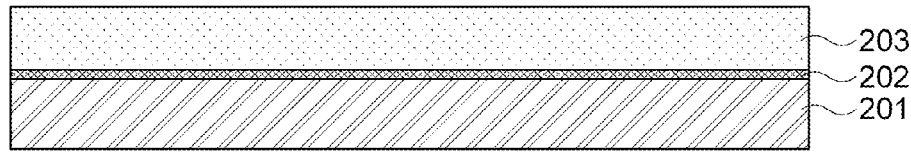
FIGS. 2A through 2F are views sequentially showing a process for removing the seed layer according to the method for removing the seed layer in manufacturing the printed circuit board according to the exemplary embodiment of the present invention.
Figure 2B:
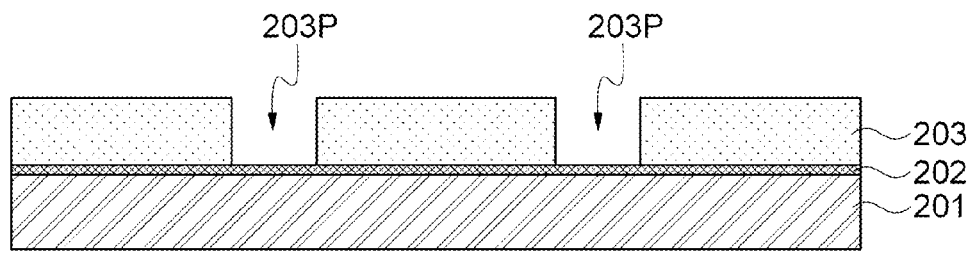
Figure 2C:
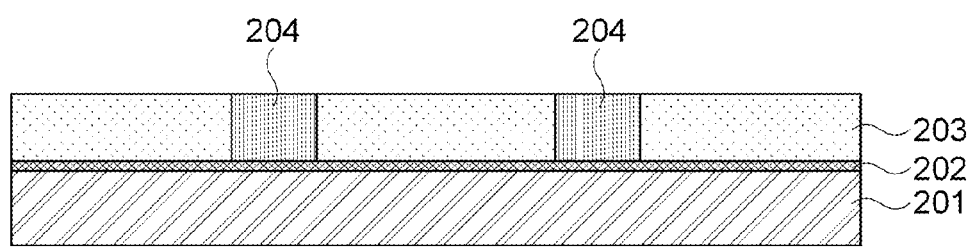
Figure 2D:
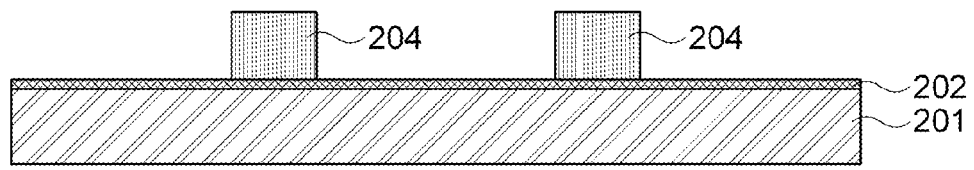
Figure 2E:
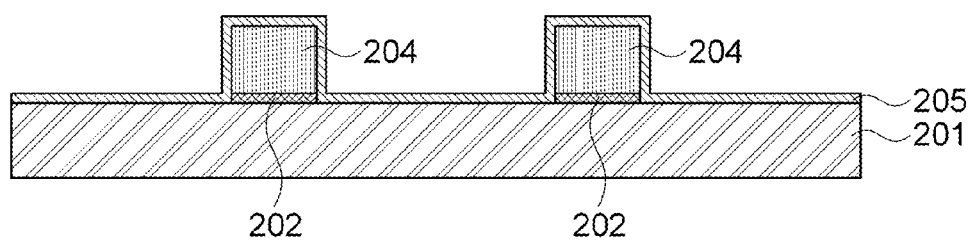
Figure 2F:
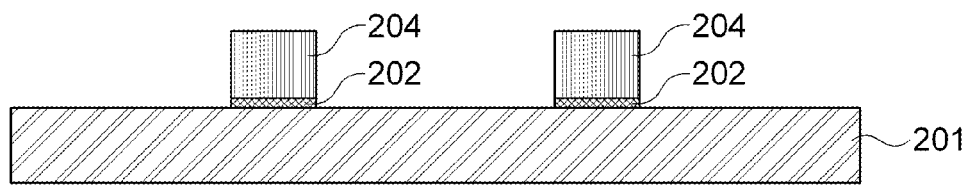

Referring to FIG. 3, the printed circuit board, which is the same as the printed circuit board that finally remains after the seed layer is removed in FIG. 2F, will be described hereinafter for convenience of explanation.

As shown in FIG. 3, the printed circuit board according to the exemplary embodiment of the present invention is the printed circuit board manufactured by using a method for removing a seed layer in manufacturing the printed circuit board, including forming a corrosion layer on surfaces of the seed layer 202 and the plating layer 204 by performing a chemical reaction of the substrate 201 from which the seed layer 202 is exposed in a reactor in which a predetermined gas (for example, a chloride ($Cl_2$ gas) is filled and then removing the seed layer 202 by irradiating a laser on the corrosion layer to remove the corrosion layer, the printed circuit board includes: a printed circuit board 201 corresponding to a base; a seed layer 202 formed on an upper surface of the printed circuit board 201 according to a predetermined pattern; and a plating layer 204 having a predetermined pattern, laminated on the seed layer 202.

Here, in particular, a chlorine (Cl) component is present on the upper surface and a side surface of the plating layer 204. The reason is that when the seed layer according to a method for removing the seed layer of the present invention as described above is removed, the chemical reaction of the substrate 201 from which the seed layer 202 is exposed is performed in a reactor in which a chlorine ($Cl_2$) gas is filled to thereby form the chlorine (for example, CuCl) corrosion layer on the surfaces of the seed layer 202 and the plating layer 204, and when the corrosion (the chloride corrosion layer) is removed, the chloride corrosion layer is not completely removed, such that the chloride component remains.

Here, the upper surface of the plating layer 204 has specific directional X-ray diffraction characteristics according to a crystal surface-220 preferential etching. The reason is that when the seed layer according to the method for removing the seed layer is removed, a laser is irradiated on the corrosion layer (the chloride corrosion layer) 205 (see FIG. 2E) to remove the corrosion layer (the chloride corrosion layer) 205, such that the seed layer 202 is removed, and in this case, since the laser is irradiated in order to remove the corrosion layer (the chloride corrosion layer) 205, a change in surface roughness is generated on the upper surface of the plating layer 204. However, an extent of the change in surface roughness cannot be visually recognized, but can be observed through a scanning electron microscope (SEM) or atomic force microscope (AFM).

As described above, in the method for removing a copper seed layer in manufacturing the printed circuit board according to the prevent invention, for removing the copper seed layer, laser ablation as the dry etching scheme rather than the wet etching scheme of the related art is adopted, and a chemical reaction occurs by the chlorine gas to form the chloride corrosion layer on the seed layer, and the laser ablation is then performed, whereby there are advantages or effect as follows.

1) Since a laser having small energy (energy of 150 $mJ/cm^2$) is used, a condition range of controlling the seed layer becomes large, such that the seed layer can be relatively precisely etched;

2) Since the laser having small energy is used, the substrate, the circuit, or the photo resist layer to be formed is less damaged even in the rework, such that repeated work is possible;

3) Since the laser having small energy is used, a step generated by repeating an area to be treated is less generated as compared to the case of using a laser of 650 $mJ/cm^2$ of the related art; and.

4) Therefore, it is favorable to form the pattern of 3 μm or less in the future.

According to the present invention, in removing the copper seed layer, laser ablation as the dry etching scheme rather than a wet etching scheme of the related art is performed, and more specifically, the chemical reaction by the chlorine gas is caused to form the chloride corrosion layer on the seed layer, and laser ablation is then performed, thereby making it possible to obtain the precise wiring pattern even with the low energy supply and preventing damage to the copper plating layer (redistribution layer: RDL).

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A printed circuit board manufactured by using a method for removing a seed layer in manufacturing the printed circuit board, including forming a corrosion layer on surfaces of the seed layer and a plating layer by performing a chemical reaction of a substrate from which the seed layer is exposed in a reactor in which a predetermined gas is filled, and removing the seed layer by irradiating a laser on the corrosion layer to remove the seed layer, removing the seed layer by irradiating a laser on the corrosion layer to remove the corrosion layer, the printed circuit board comprising:
   a printed circuit board corresponding to a base;
   the seed layer formed on an upper surface of the printed circuit board according to a predetermined pattern; and
   the plating layer having a predetermined pattern and laminated on the seed layer,
   wherein the plating layer has a chlorine (Cl) component present on the upper surface and a side surface thereof.

2. The printed circuit board according to claim 1, wherein the upper surface of the plating layer has specific directional X-ray diffraction characteristics according to a crystal surface-220 preferential etching.

3. A method for removing a seed layer in manufacturing a printed circuit board, the method comprising:
   forming a photo resist layer on a printed circuit board having a seed layer formed on a surface thereof;
   removing the photo resist layer according to a predetermined pattern;
   forming a plating layer for a circuit on the predetermined pattern from which the photo resist layer is removed;
   exposing the seed layer by removing the photo resist layer around the plating layer;
   forming a corrosion layer on surfaces of the seed layer and the plating layer by performing a chemical reaction of the substrate from which the seed layer is exposed in a reactor in which a predetermined gas is filled; and
   removing the seed layer by irradiating a laser on the corrosion layer to remove the corrosion layer.

4. The method according to claim 1, wherein in the forming a photo resist layer, the seed layer is formed of a copper (Cu) layer or a composite layer in which the copper layer and a hetero metal layer are laminated.

5. The method according to claim 2, wherein the composite metal layer is formed of any one single metal layer selected from a group consisting of Ti, Cr, Ni, Mo, Ta, W, TiW, NiCu, NiCr, TaW, and TiN, or an alloy layer thereof.

6. The method according to claim 1, wherein in the forming a photo resist layer, the photo resist layer is formed by using a plating scheme.

7. The method according to claim 1, wherein in the removing the photo resist layer, a mask having a predetermined pattern is attached onto the photo resist layer and then a photolithography process is performed thereon, in order to remove the photo resist layer according to a predetermined pattern.

8. The method according to claim 1, wherein in the forming a plating layer, the plating layer is a copper (Cu) plating layer.

9. The method according to claim 1, wherein in the forming a plating layer, the plating layer is formed by using an electrolysis plating method.

10. The method according to claim 1, wherein in the forming a corrosion layer, the chemical reaction of the substrate from which the seed layer is exposed is performed in a reactor in which any one gas is filled, the gas being selected from a group consisting of chlorine ($Cl_2$) gas, chloroform ($CHCl_3$) gas, hydrogen chloride (HCl) gas, carbon tetrachloride ($CCl_4$) gas, and boron trichloride ($BCl_3$) gas.

11. The method according to claim 10, wherein the chemical reaction by any one gas selected from a group consisting of chlorine ($Cl_2$) gas, chloroform ($CHCl_3$) gas, hydrogen chloride (HCl) gas, carbon tetrachloride ($CCl_4$) gas, and boron trichloride ($BCl_3$) gas includes a plasma treatment by the selected gas.

12. The method according to claim 10, wherein a corrosion rate by any one gas selected from the group consisting of chlorine ($Cl_2$) gas, chloroform ($CHCl_3$) gas, hydrogen chloride (HCl) gas, carbon tetrachloride ($CCl_4$) gas, and boron trichloride ($BCl_3$) gas is increased by injecting argon (Ar) into the reactor and applying a bias to the substrate while simultaneously performing a chemical reaction by the gas selected from the group consisting of chlorine ($Cl_2$) gas, chloroform ($CHCl_3$) gas, hydrogen chloride (HCl) gas, carbon tetrachloride ($CCl_4$) gas, and boron trichloride ($BCl_3$) gas.

13. The method according to claim 12, wherein the corrosion rate by any one gas selected from the group consisting of chlorine ($Cl_2$) gas, chloroform ($CHCl_3$) gas, hydrogen chloride (HCl) gas, carbon tetrachloride ($CCl_4$) gas, and boron trichloride ($BCl_3$) gas is constantly maintained by injecting a hydrogen ($H_2$) gas into the reactor.

14. The method according to claim 1, wherein in the forming a corrosion layer, a chloride corrosion layer is formed on surfaces of the seed layer and the plating layer.

15. The method according to claim 1, wherein in the removing the seed layer, a laser having an energy of 150 mJ/□ is irradiated on the corrosion layer, in order to remove the corrosion layer.

* * * * *

UNITED STATES PATENT AND TRADEMARK OFFICE
CERTIFICATE OF CORRECTION

Page 1 of 2

PATENT NO. : 8,957,319 B2
APPLICATION NO. : 13/826857
DATED : February 17, 2015
INVENTOR(S) : Sung Han et al.

It is certified that error appears in the above-identified patent and that said Letters Patent is hereby corrected as shown below:

In the Claims:
In Claim 4, Column 7, Line 41, delete "claim 1," insert -- claim 3 --, therefor.
In Claim 5, Column 7, Line 45, delete "claim 2," insert -- claim 4 --, therefor.
In Claim 6, Column 7, Line 49, delete "claim 1," insert -- claim 3 --, therefor.
In Claim 7, Column 8, Line 1, delete "claim 1," insert -- claim 3 --, therefor.
In Claim 8, Column 8, Line 7, delete "claim 1," insert -- claim 3 --, therefor.
In Claim 9, Column 8, Line 10, delete "claim 1," insert -- claim 3 --, therefor.
In Claim 10, Column 8, Line 13, delete "claim 1," insert -- claim 3 --, therefor.
In Claim 10, Column 8, Line 17, delete "CHCI$_3$" insert -- (CHCl$_3$) --, therefor.
In Claim 10, Column 8, Line 18, delete "(HCI)" insert -- (HCl) --, therefor.
In Claim 10, Column 8, Line 18, delete "(CCI$_4$)" insert -- (CCl$_4$) --, therefor.
In Claim 10, Column 8, Line 19, delete "(BCI$_3$)" insert -- (BCl$_3$) --, therefor.
In Claim 11, Column 8, Line 22, delete "(CHCI$_3$)" insert -- (CHCl$_3$) --, therefor.
In Claim 11, Column 8, Line 23, delete "(HCI)" insert -- (HCl) --, therefor.
In Claim 11, Column 8, Line 23, delete "(CCI$_4$)" insert -- (CCl$_4$) --, therefor.
In Claim 11, Column 8, Line 24, delete "(BCI$_3$)" insert -- (BCl$_3$) --, therefor.
In Claim 12, Column 8, Line 28, delete "(CHCI$_3$)" insert -- (CHCl$_3$) --, therefor.
In Claim 12, Column 8, Line 29, delete "(HCI)" insert -- (HCl) --, therefor.
In Claim 12, Column 8, line 29, delete "(CCI$_4$)" insert -- (CCl$_4$) --, therefor.
In Claim 12, Column 8, Line 30, delete "(BCI$_3$)" insert -- (BCl$_3$) --, therefor.
In Claim 12, Column 8, Line 35, delete "(CHCI$_3$)" insert -- (CHCl$_3$) --, therefor.
In Claim 12, Column 8, Line 35, delete "(HCI)" insert -- (HCl) --, therefor.
In Claim 12, Column 8, Line 36, delete "(CCI$_4$)" insert -- (CCl$_4$) --, therefor.
In Claim 12, Column 8, Line 36, delete "(BCI$_3$)" insert -- (BCl$_3$) --, therefor.
In Claim 13, Column 8, Line 40, delete "(CHCI$_3$)" insert -- (CHCl$_3$) --, therefor.
In Claim 13, Column 8, Line 41, delete "(HCI)" insert -- (HCl) --, therefor.
In Claim 13, Column 8, Line 41, delete "(CCI$_4$)" insert -- (CCl$_4$) --, therefor.
In Claim 13, Column 8, Line 42, delete "(BCI$_3$)" and insert -- (BCl$_3$) --, therefor.

Signed and Sealed this
Twentieth Day of October, 2015

Michelle K. Lee
*Director of the United States Patent and Trademark Office*

CERTIFICATE OF CORRECTION (continued)
U.S. Pat. No. 8,957,319 B2

In Claim 14, Column 8, Line 44, delete "claim 1," and insert -- claim 3, --, therefor.
In Claim 15, Column 8, Line 47, delete "claim 1," and insert -- claim 3, --, therefor.
In Claim 15, Column 8, Line 48, delete "150mJ/□," and insert -- 150mJ/cm$^2$ --, therefor.